(12) United States Patent
DeMarchis et al.

(10) Patent No.: US 6,643,130 B1
(45) Date of Patent: Nov. 4, 2003

(54) WASH DOWN FILTERED FAN APPARATUS

(76) Inventors: John A. DeMarchis, 603 Birch St., Jeannette, PA (US) 15644; Jeffrey S. Palmer, R.D. 2, Box 356, Ligonier, PA (US) 15658

( * ) Notice: Subject to any disclaimer, the term of this patent is extended or adjusted under 35 U.S.C. 154(b) by 0 days.

(21) Appl. No.: 10/189,687

(22) Filed: Jul. 8, 2002

(51) Int. Cl.[7] ................................. H05K 7/20
(52) U.S. Cl. .................. 361/695; 165/80.3; 454/184
(58) Field of Search ................. 174/16.1; 312/236; 454/184, 275, 280, 283, 367; 165/80.3, 121–126; 361/687, 690, 692, 694, 695, 717–719

(56) References Cited

U.S. PATENT DOCUMENTS

| | | | |
|---|---|---|---|
| 4,302,793 A | * 11/1981 | Rohner | 361/699 |
| 5,199,414 A | * 4/1993 | McMillon | 126/99 R |
| 5,201,879 A | 4/1993 | Steele | |
| 5,573,562 A | 11/1996 | Schauwecker et al. | |
| 6,149,698 A | 11/2000 | Uehara | |

* cited by examiner

*Primary Examiner*—Gerald Tolin
(74) *Attorney, Agent, or Firm*—H. Keith Hauger

(57) ABSTRACT

A wash down filtered fan apparatus for cooling and filtering a cabinet enclosure housing electromechanical equipment and sensitive electronics is provided consisting of an intake housing and exhaust housing. A blower mounted within an intake housing induces ambient air for cooling while a plurality of downwardly angled baffles provide protection at both intake and exhaust ports preventing the threat of detrimental external elements consisting of dust, residue, rain, pressurized water and other splashing liquids from penetrating such apparatus and cabinet enclosure housing.

18 Claims, 6 Drawing Sheets

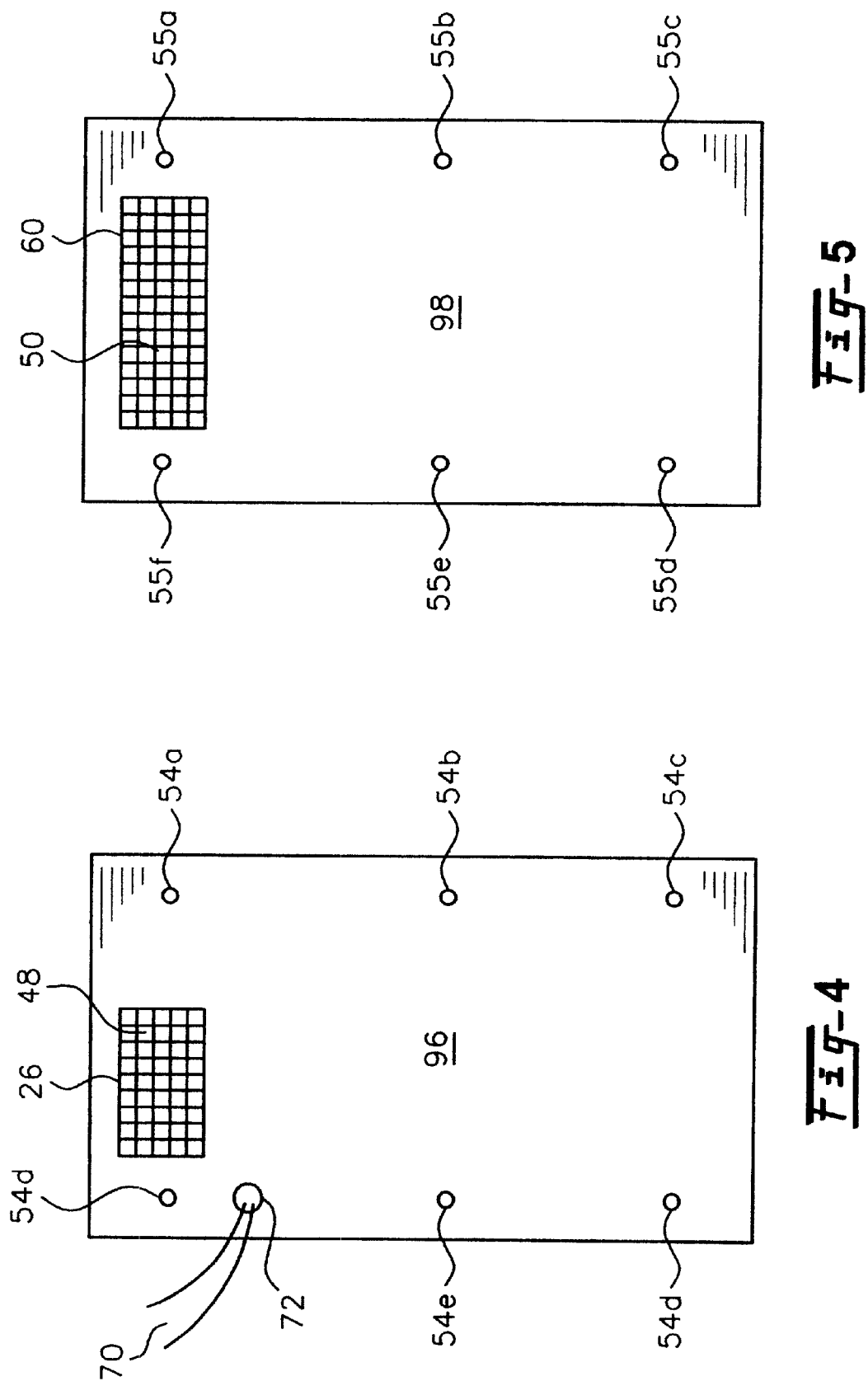

WASH DOWN FILTERED FAN APPARATUS

BACKGROUND OF THE PRESENT INVENTION

1. Field of the Invention

The present invention relates to a wash down filtered fan apparatus in combination with a sealed enclosure enfolding electromechanical equipment for protection from detrimental external elements. More particularly, this invention relates to an apparatus that protects computers, electronic systems and electromechanical equipment from harsh industrial environments and outside weather conditions while at the same time serving as a means for cooling these components.

2. Description of the Prior Art

Industry and manufacturing in America and globally have emerged with the widespread use of a variety of electronically and computer controlled systems as well as the more traditional electromechanical equipment. Thus, to protect these systems from harsh industrial environments same are typically placed in sealed enclosures or work stations that permit efficient operation without the threat of being exposed to exterior contaminates including dust, residue, rain and liquids that have the potential to cause serious damage. Since the electromechanical equipment and electronics generate heat within the enclosure, various cooling equipment such as air conditioners, heat exchangers, in-line compressed air coolers and filtered fan systems are used to maintain required operating temperatures within the enclosure.

These systems treat the enclosed air only, while sealing out the potential contaminated ambient environment. In cases where the ambient air is near room temperature (70–85 degrees Fahrenheit) and when there is not a threat of rain or splashing liquids present outside the enclosure, a filtered fan system is used to maintain a constant flow of filtered ambient air through the enclosure. These systems, typically are less costly than closed-looped systems and simply employ a fan which induces the cooler ambient air through a filter media into the enclosure, therefore creating a positive pressure inside the enclosure forcing the hot enclosure air out through an exhaust vent.

U.S. Pat. No. 5,573,562 entitled "Water Type Filter for Electrical Equipment Vent" and issued to Schauwecker discloses an air filter venting assembly employing a sloped filter placement in a channel with a bottom opening which vents air out through a bottom of the channel. Another concept is explored in U.S. Pat. No. 6,149,698 entitled "Apparatus for Installing a Ventilation Fan" issued to Uehara wherein there is disclosed an air filtering system fixture that is used in conjunction with a building ventilation fan to eliminate contaminated air from leaving or entering a building. A third type of vent is disclosed in U.S. Pat. No. 5,201,879 entitled "Vent for Enclosures" issued to Steele. This invention discloses an air-venting device serving to eliminate water from entering an enclosure through the vent while providing a safety device to eliminate tampering by a vertically mounted baffle blocking any attempt to stick a probe through the vent from the outside.

The prior art fails to provide a system that is capable of filtering and cooling electromechanical equipment and sensitive electronics while simultaneously preventing splashing liquids, rain water and other adverse conditions from entering an enclosure.

SUMMARY OF THE INVENTION

It is, therefore, an object of the present invention to provide an innovative wash down filtered fan apparatus in combination with a sealed enclosure which protects electromechanical equipment and sensitive electronics from detrimental external elements.

It is the further object of the present invention to eliminate the threat of splashing liquids, water sprays, rain, snow and/or direct hose down occurring in the environment surrounding the enclosure from entering same.

It is the further object of the present invention to provide in addition to a ventilating system a powerful filtered cooling system for operation in connection with a sealed enclosure.

It is the further object of the present invention to provide an innovative wash down filtered fan apparatus that is easily adaptable to existing sealed enclosures.

It is the further object of the present invention to provide a durable and inexpensive means of protecting electromechanical equipment and sensitive electronics from detrimental external elements.

It is the further object of the present invention to save users a considerable amount of time previously necessary to repair, clean and replace electromechanical equipment and sensitive electronics from damage caused by detrimental external elements.

And yet, the further object of this invention is to provide a wash down filtered fan apparatus in combination with a sealed enclosure enfolding electromechanical equipment for protection from detrimental external elements, comprising an intake housing secured to a first vertical surface of said sealed enclosure having a downwardly oriented intake inlet port, an intake outlet port, and at least one intake baffle located upward from said intake inlet port; a suction means secured within said intake housing for inducing ambient air into said intake inlet port for passage into said sealed enclosure and about said electromechanical equipment extracting heat from said electromechanical equipment; an exhaust housing secured to a second opposing vertical surface of said sealed enclosure having an exhaust inlet port for acceptance of high temperature end air internally generated within said sealed enclosure, a downwardly oriented exhaust outlet port, at least one exhaust baffle located upward from said exhaust outlet port, functioning in combination to promote efficient exit of said high end temperature air to said ambient air.

These objects, as well as other objects and advantages of the present invention, will be become apparent from the following description, in reference to the illustrations appended hereto.

BRIEF DESCRIPTION OF THE DRAWINGS

For a better understanding of the invention, reference may be had to the accompanying drawings, in which:

FIG. 4 depicts an intake rear wall of an intake base panel;

FIG. 5 depicts an exhaust rear wall of an exhaust base panel.

DESCRIPTION OF PREFERRED EMBODIMENTS

Figure 1:
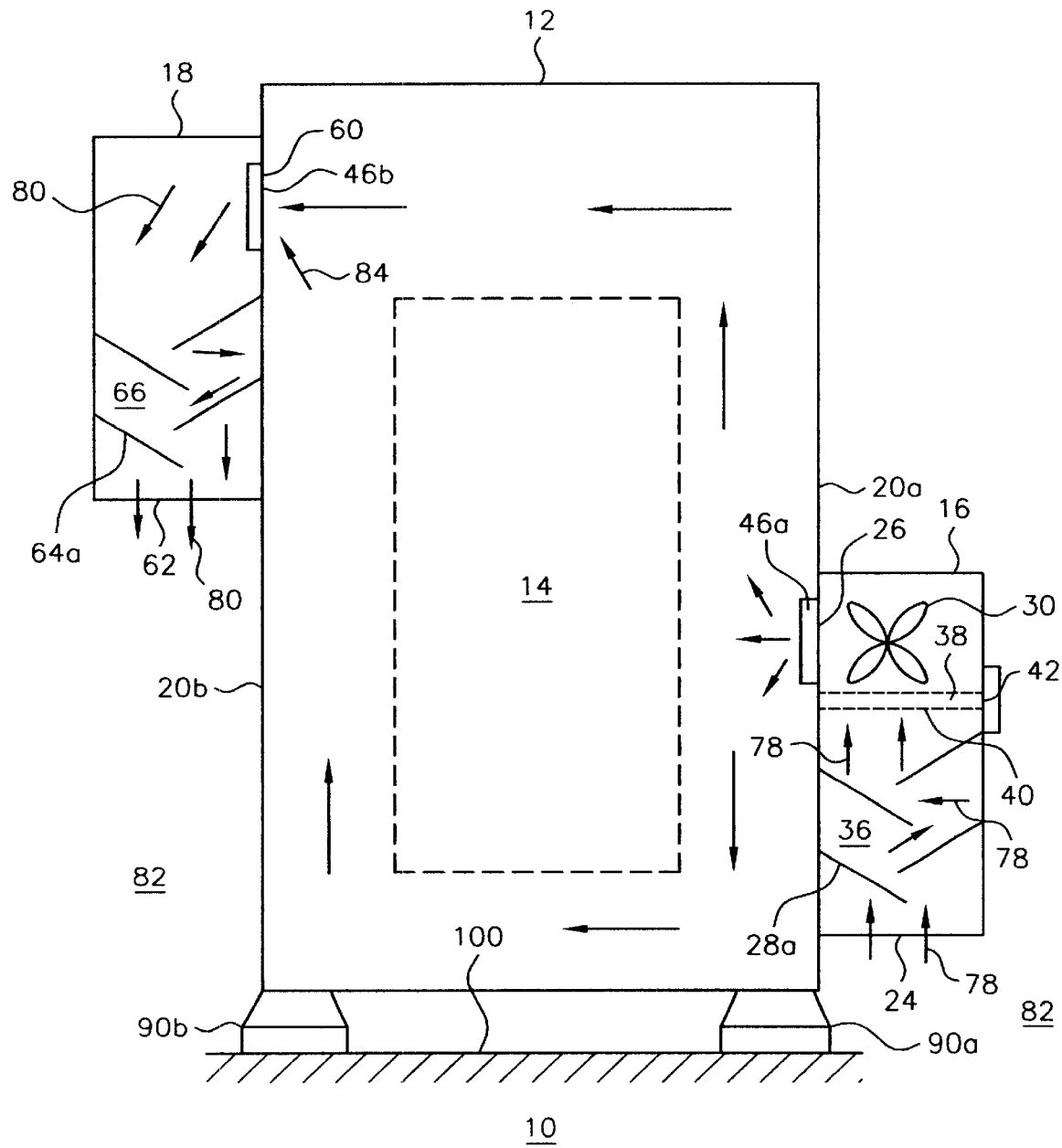
FIG. 1 a cross sectional view of a wash down filtered fan apparatus in combination with a sealed enclosure enfolding electromechanical equipment and/or sensitive electronic

Referring to the drawings, FIG. 1 is cross-sectional side elevation view of a wash down filtered fan apparatus 10 in combination with a sealed enclosure 12 enfolding electromechanical equipment 14 for protection from detrimental external elements in ambient air 82. Typically sealed enclosure 12 is supported above a surface 100 by a first enclosure support foot 90a and a second enclosure support foot 90b. Specifically, electromechanical equipment 14 along with computers and sensitive electronic systems are often housed in sealed enclosure 12 requiring particular care with respect to harsh industrial environments and outside weather conditions. Thus, residues, rain, snow and other liquids are a constant threat to electromechanical equipment 14 computers and other sophisticated electronic apparatus. A wash down filtered fan apparatus 10 has been designed to include intake housing 16 and exhaust housing 18 which effectively prevent any threat of water, spray, rain and/or direct pressurized water which may be sprayed into an intake inlet port 24 or exhaust outlet port 62. Wash down filtered fan apparatus 10 may be constructed from a variety of materials with stainless steel being preferential.

Figure 2:
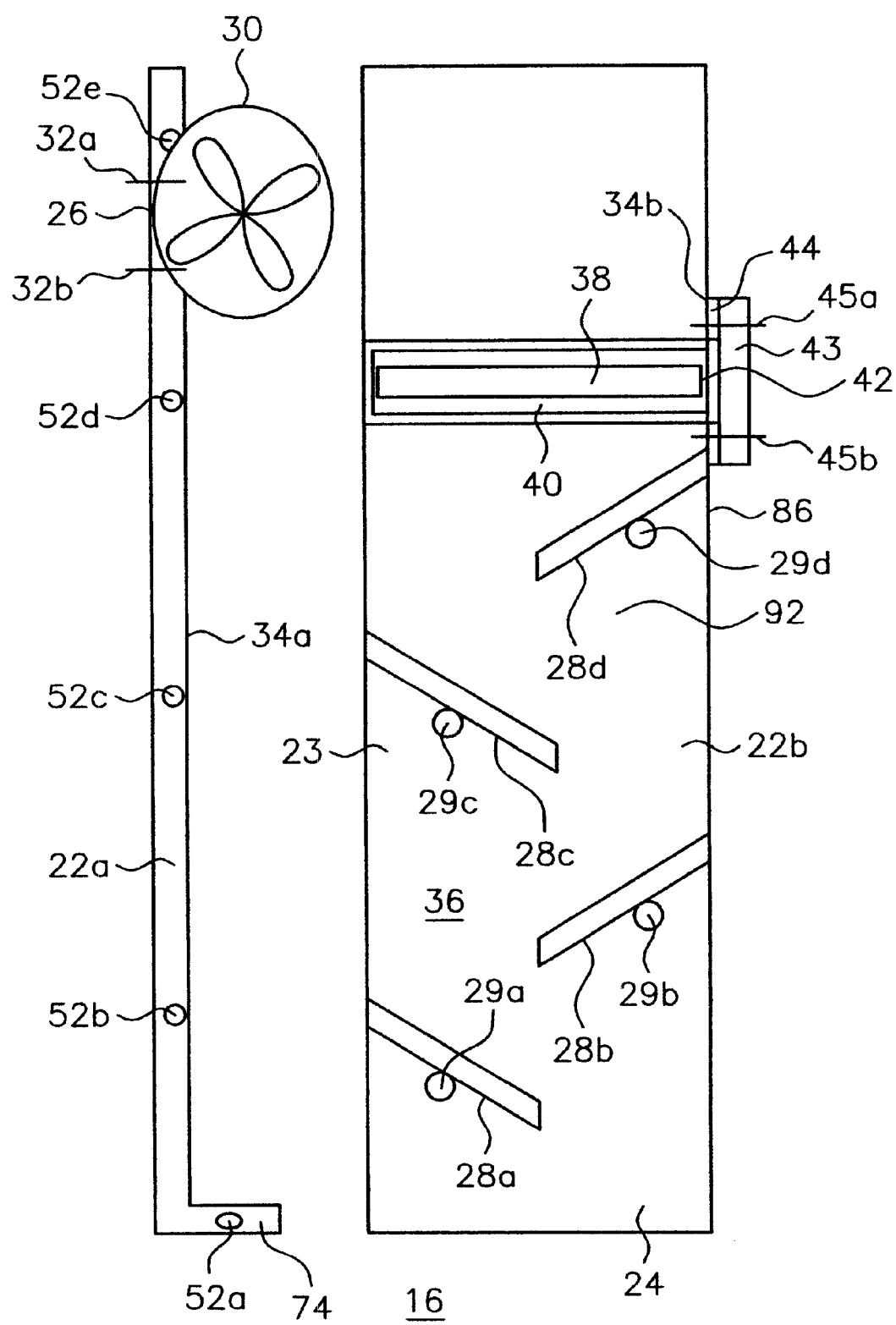
FIG. 2 represents a side cross-section view of an intake housing.
Figure 2A:
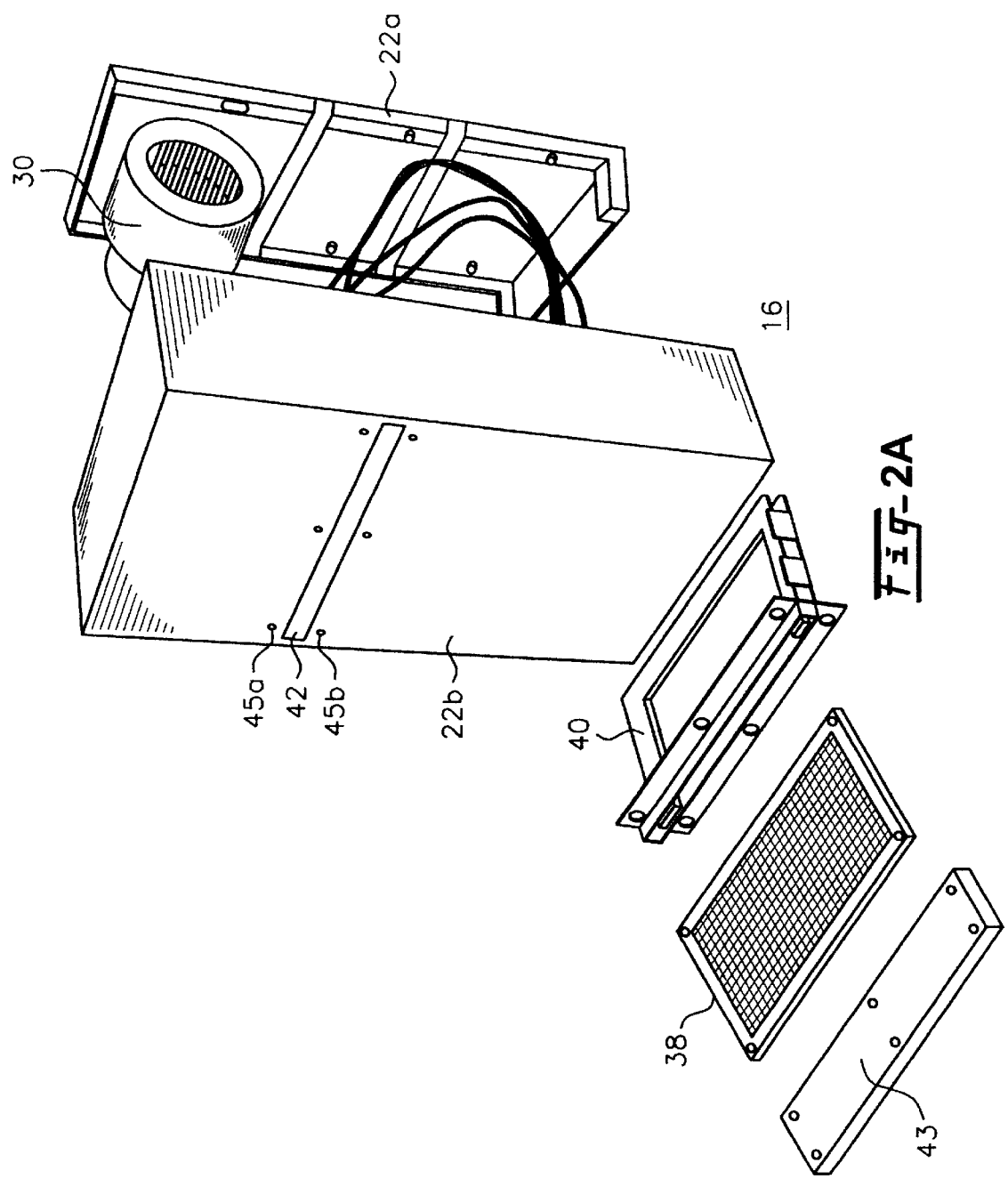
FIG. 2A represents a perspective break out view of an intake housing.

As is shown in FIGS. 1 and 4, an intake housing 16 is secured by first enclosure fasteners 54a, 54b, 54c, 54d, 54e, 54f, preferably a plurality of nuts and bolts, to a first vertical surface 20a of said sealed enclosure 12 having a downwardly oriented intake inlet port 24, an intake outlet port 26 and a plurality of downwardly angled intake baffles 28a, 28b, 28c and 28d located upward from said intake inlet port 24. A blower assembly 30 is secured by blower assembly fasteners 32a and 32b, preferably a plurality of nuts and bolts, upward from intake baffles 28a, 28b, 28c and 28d within intake housing 16 for inducing ambient air 82 into intake inlet port 24, through an intake passage 36 following intake directional air flow 78 and into sealed enclosure 12 circulating around and about electromechanical equipment 14 for cooling purposes. As shown in FIG. 2 and FIG. 2A, intake housing 16 consists of two major components being intake base panel 22a and intake cover panel 22b that fit together to form a box, whereby baffles 28a, 28b, 28c and 28d are secured by intake baffle fasteners 29a, 29b, 29c and 29d, preferably a plurality of nuts and bolts, to a pair of opposing intake sidewalls, one of which is shown as intake sidewall 92. Baffles 28a, 28b, 28c and 28d extend a width of intake housing 16 and are preferably oriented downward at a 75° angle, staggered at a spaced distance from each other. Although a 75° angle is preferred for maximum efficiency, this angle may be varied in either direction. Intake cover panel 22b is designed with an open side 23 facing intake base panel 22a such that when assembled baffles 28a, 28b, 28c and 28d form a barrier allowing ambient air 82 to flow freely through intake passage 36 around and about baffles 28a, 28b, 28c and 28d, but at the same time functioning to block entrance of liquids and other harsh elements from entering into sealed enclosure 12.

An air permeable filter 38 shown in FIG. 2 and FIG. 2A, is horizontally and removably secured to slide into and out of a channel 40 downward from blower assembly 30 and upward from intake baffles 28a, 28b, 28c and 28d within intake housing 16. Permeable filter 38 functions to screen out undesirable air borne particulate from entrance into sealed enclosure 12. Permeable filter 38 is inserted and removed to and from channel 40 through channel aperture 42 shown in FIG. 2 for easy cleaning and replacement of permeable filter 38. Channel 42 is located between open side 23 of intake housing 16 for fitting flush to vertical intake surface 34a of intake base panel 22a and second opposing vertical intake surface 34b of intake cover plate 22b. Channel 40 is sealed with a removable cover plate 43 conforming to a shape and size of channel aperture 42. Permeable filter 38 functions in cooperation with blower assembly 30 and intake baffles 28a, 28b, 28c and 28d to filter ambient air 82 which is being drawn into wash down filtered fan apparatus 10 by a powerful suction force created by blower assembly 30. Thus, the protected area within sealed enclosure 12 is kept clean and cool. After installing permeable air filter 38, a removable cover plate 43 is secured over a cover plate gasket 44 by cover plate fasteners 45a and 45b, preferably a plurality of nuts and bolts, and a perimeter of channel aperture 42 between an outside vertical intake surface 86 and inside surface of cover plate 43.

Figure 3:
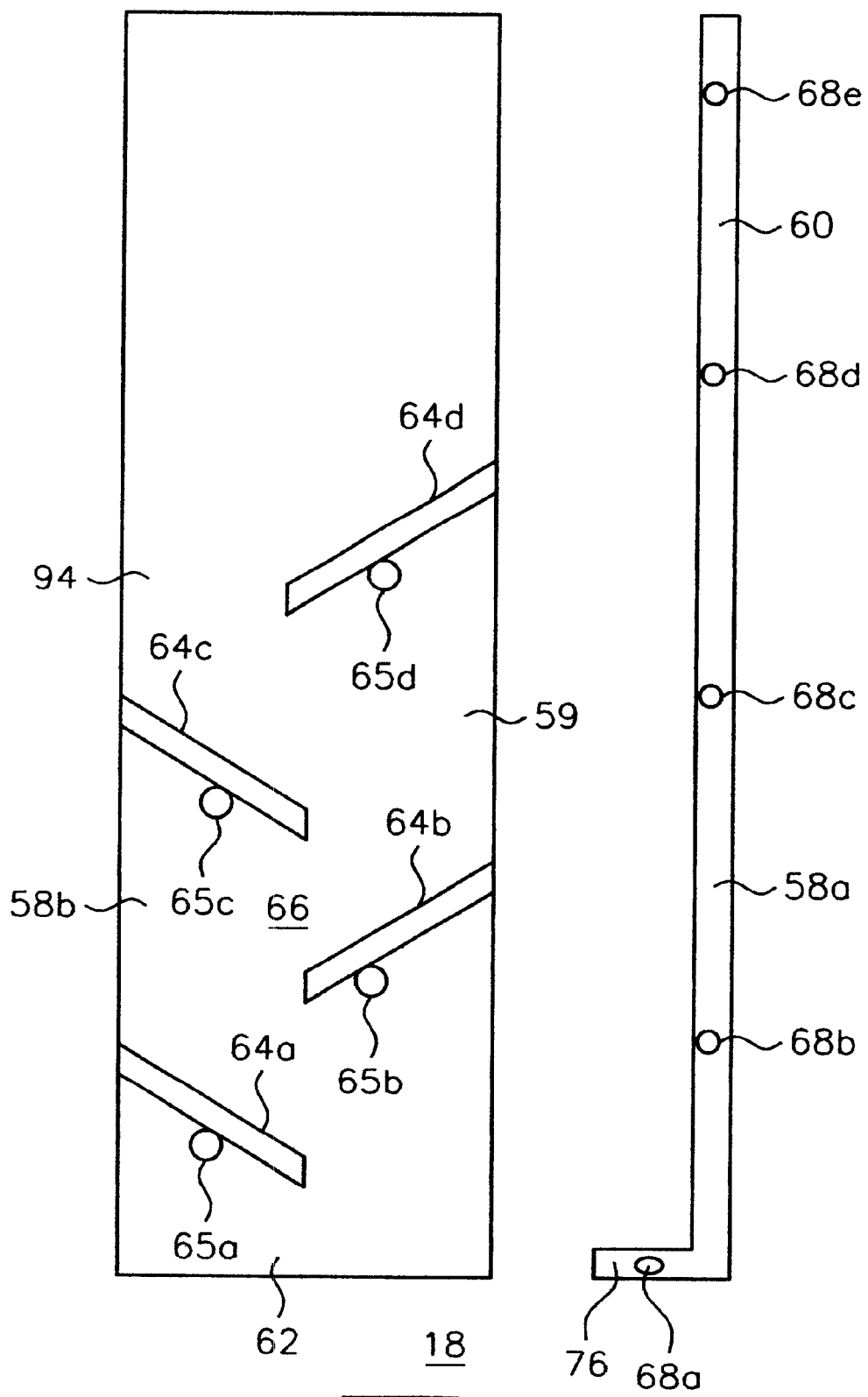
FIG. 3 represents a side cross-section view of an exhaust housing.
Figure 3A:
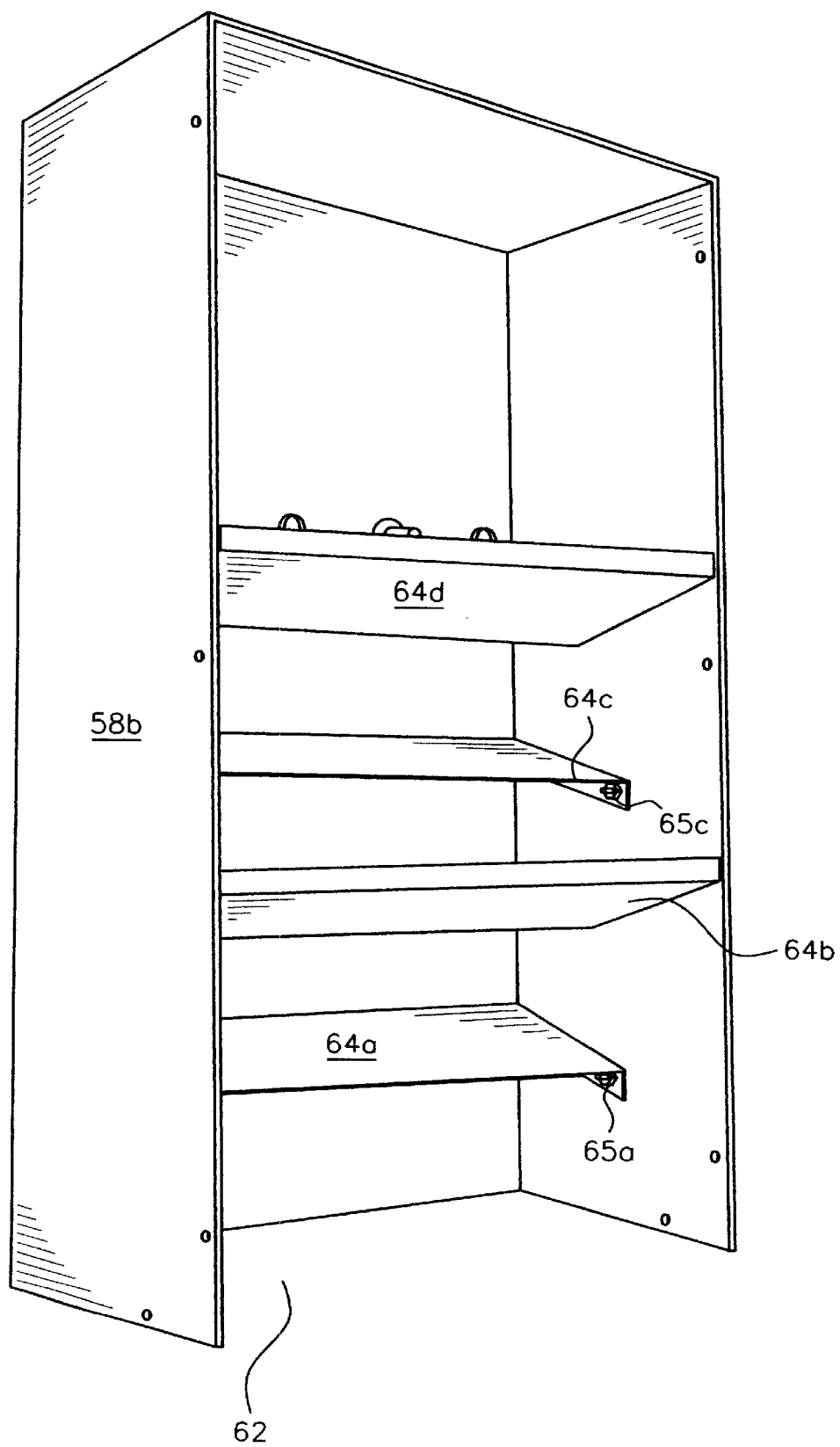
FIG. 3A represents a perspective break out view of an exhaust housing.

As is shown in FIGS. 1 and 5, an exhaust housing 18 is secured by second enclosure fasteners, 55a, 55b, 55c, 55d, 55e, and 55f, preferably a plurality of nuts and bolts, to a second opposing vertical surface 20b of sealed enclosure 12 having an exhaust inlet port 60 for acceptance of high end air temperature air 84 which is internally generated within sealed enclosure 12. FIG. 3 and FIG. 3A illustrate a downwardly oriented exhaust outlet port 62 that functions in cooperation with a plurality of downwardly angled exhaust baffles 64a, 64b, 64c and 64d located upward from an exhaust outlet port 62 to promote efficient exit of high end temperature air 84 following exhaust directional air flow 80 through exhaust passage 66 for return back to ambient air 82. As is shown in FIG. 3, exhaust housing assembly 18 consists of two major components being exhaust base panel 58a and exhaust cover panel 58b that fit together to form a second box, whereby baffles 64a, 64b, 64c and 64d are secured by exhaust baffle fasteners 65a, 65b, 65c and 65d, preferably a plurality of nuts and bolts to a pair of opposing exhaust sidewalls one of which is shown as exhaust sidewall 94. Exhaust baffles 64a, 64b, 64c and 64d extend a width of exhaust housing 18 and are preferably oriented downward at a 75° angle, staggered at a spaced distance from each other. Although 75° is the preferred angle for maximum efficiency, this angle may vary in either direction Exhaust cover panel 58b is designed with an open side 59 facing exhaust base panel 58a such that when assembled, exhaust baffles 64a, 64b, 64c and 64d form a barrier allowing high end temperature air 84 to flow freely through exhaust passage 66 around exhaust baffles 64a, 64b, 64c and 64d, but at the same time functioning to block entrance of liquids and other harsh elements into sealed enclosure 12, exhaust baffles 64a, 64b, 64c and 64d.

To assemble intake housing 16, intake base panel 22a is secured to intake cover panel 22b by intake housing fasteners 52a, 52b, 52c, 52d and 52e. Once intake housing 16 is assembled, it is ready to be secured to sealed enclosure 12 on first vertical surface 20a such that intake outlet port 26 corresponds in shape and size to first cutout 46a within first vertical surface 20a enabling free flow of ambient air 82 into sealed enclosure 12. A gasket is provided at a perimeter of first cutout 46a for insertion between sealed enclosure 12 and intake housing 16 to ensure a watertight seal. Likewise, to assemble exhaust housing 18, exhaust base panel 58a is secured to exhaust cover panel 58b by exhaust housing fasteners 68a, 68b, 68c, 68d and 68e. Once exhaust housing 18 is assembled, it is ready to be secured to sealed enclosure 12 on second opposing vertical surface 20b such that exhaust inlet port 60 corresponds in shape and size to second cutout 46b within second opposing vertical surface 20b enabling free flow of high end temperature air 84 into exhaust housing 18. A gasket is provided at a perimeter of second cutout 46b for insertion between sealed enclosure 12 and intake housing 16 to ensure a watertight seal. As is shown in FIG. 4 and FIG. 5, intake outlet port 26 within intake rear wall 96 an exhaust inlet port 60 within exhaust rear wall 98 are preferably constructed in the form of outlet lattice grid 48 and inlet lattice grid 50 respectively, for additional filtration purposes in keeping sealed enclosure 12 free from damaging particulate. As is seen in FIG. 2, once intake housing 16 is assembled, an intake base ledge 74 extends partially over intake inlet port 24. Likewise, once exhaust housing 18 is assembled, exhaust base ledge 76 extends partially over exhaust outlet port 62. Thus, intake base ledge 74 allows free flow of ambient air 82 into intake housing 16 adding additional protection from splashing liquids and other damaging elements. Exhaust base ledge 76 provides additional protection at exhaust outlet port 62 without inhibiting high end temperature air 84 from exiting exhaust housing 18.

Blower assembly 30 is preferably constructed consisting of an electric motor in connection with any of a variety of centrifugal fans encased within a housing. As is shown in FIG. 4, an electrical power source 70 is provided to said electric motor, which may be activated and deactivated by any of a variety of electrical switches 7.

We claim:

1. A wash down filtered fan apparatus in combination with a sealed enclosure enfolding electromechanical equipment for protection from detrimental external elements, comprising:
    an intake housing secured to a first vertical surface of said sealed enclosure having a downwardly oriented intake inlet port, an intake outlet port, and at least one intake baffle located upward from said intake inlet port;
    a suction means secured within said intake housing for inducing ambient air into said intake inlet port for passage into said sealed enclosure and about said electromechanical equipment extracting heat from said electromechanical equipment;
    an exhaust housing secured to a second opposing vertical surface of said sealed enclosure having an exhaust inlet port for acceptance of high temperature end air internally generated within said sealed enclosure, a downwardly oriented exhaust outlet port, at least one exhaust baffle located upward from said exhaust outlet port, functioning in combination to promote efficient exit of said high end temperature air to said ambient air.

2. A wash down filtered fan apparatus according to claim 1, whereby an air-permeable filter is located downward from said suction means and above said intake baffle within said intake housing for screening out undesirable particulate from entrance into said sealed enclosure.

3. A wash down filtered fan apparatus according to claim 2, wherein said filter is horizontally and removably secured within a channel for cleaning and replacement purposes.

4. A wash down filtered fan apparatus according to claim 3, wherein said filter is inserted and removed to and from said channel through a channel aperture, said channel being located between a first vertical inside intake surface and a second opposing vertical inside intake surface of said intake housing, whereby said channel is covered with a removable cover plate conforming to a shape and size of said channel aperture.

5. A wash down filtered apparatus according to claim 4, whereby a cover plate gasket is secured on a perimeter of said channel aperture between an outside vertical intake surface and said cover plate.

6. A wash down filtered apparatus according to claim 4, whereby said channel is generally constructed as a frame structure for acceptance of said filter.

7. A wash down filtered apparatus according to claim 6, whereby said filter is formed from a network of webbed pores.

8. A wash down filtered fan apparatus according to claim 1, whereby said intake housing consists of an intake base panel generally being of L-shaped cross section for cooperatively fitting to an intake cover panel at an open side of said intake cover panel and said exhaust housing consists of an exhaust base panel generally being of L-shaped cross section for cooperatively fitting to an exhaust cover panel at an open side of said exhaust cover panel.

9. A wash down filtered fan apparatus according to claim 1, whereby said suction means consists of a blower secured to an upper section of said intake base panel.

10. A wash down filtered apparatus according to claim 1, wherein said intake baffle is downwardly angled functioning to prevent a threat of liquids from entering said intake housing, simultaneously allowing said ambient air to flow around said intake baffle and upward through an intake passage within said intake housing into said sealed enclosure through a first cut-out, said exhaust baffle is downwardly angled functioning to allow said high end temperature air to flow through a second cut-out into an exhaust passage of said exhaust housing in a downward direction into said ambient air functioning to prevent said threat of liquids from entering said exhaust housing.

11. A wash down filtered fan apparatus according to claim 10, whereby said intake outlet port and said exhaust inlet port are constructed in the form of a lattice grid.

12. A wash down filtered fan apparatus in combination with a sealed enclosure enfolding electromechanical and sensitive electronics equipment for protection from detrimental external elements, comprising:
    an intake housing secured to a first vertical surface of said sealed enclosure having a downwardly oriented intake inlet port, an intake outlet port, and a plurality of downwardly angled intake baffles located upward from said intake inlet port, said intake baffles functioning to prevent said detrimental external elements comprising dust, residue, rain, pressurized water and other splashing liquids from penetrating said intake inlet port;
    a blower upwardly secured upward from said baffles within said intake housing for inducing ambient air into said intake inlet port through an intake passage into said sealed enclosure and about said electromechanical equipment for cooling of said electromechanical equipment;
    an exhaust housing secured to a second opposing vertical surface of said sealed enclosure having an exhaust inlet port for acceptance of high end temperature end air internally generated within said sealed enclosure, a downwardly oriented exhaust outlet port, a plurality of downwardly angled outlet baffles located upward from said exhaust outlet port, functioning in combination to promote efficient exit of said high end temperature air through an exhaust passage back to said ambient air, said outlet baffles functioning to prevent said detrimental elements comprising said dust, said residue, said rain, said pressurized water and said other splashing liquids from penetrating said exhaust outlet;
    an air permeable filter horizontally and removably secured within a channel downward from said blower and upward from said intake baffles within said intake housing for screening out undesirable particulate from entrance into said sealed enclosure.

13. A wash down filtered fan apparatus according to claim 12, wherein said intake baffles are staggered and extend in alternative placement from opposing intake inside side walls of said intake housing and said exhaust baffles are staggered and extend in alternative placement from opposing inside sidewalls of said exhaust housing.

14. A wash down filtered fan apparatus according to claim 13, wherein said filter is inserted and removed to and from said channel through a channel aperture, said channel being located between a first vertical intake surface and a second opposing vertical intake surface of said intake housing, whereby said channel is sealed with a removable cover plate conforming to a shape and size of said channel aperture.

15. A wash down filtered fan apparatus according to claim 14, whereby a cover plate gasket is secured by a fastening means by a fastening means on a perimeter of said channel aperture between an outside vertical intake surface and said cover plate.

16. A wash down filtered fan apparatus according to claim 15, whereby said channel generally consists of a frame structure for acceptance of said filter.

17. A wash down filtered fan apparatus according to claim 16, whereby said filter is formed from a network of webbed pores.

18. A wash down filtered fan apparatus according to claim 17, whereby said blower consists of an electric motor and a centrifugal fan encased within a housing.

* * * * *